United States Patent
John et al.

(10) Patent No.: US 8,947,124 B2
(45) Date of Patent: Feb. 3, 2015

(54) CLOCK GATER WITH INDEPENDENTLY PROGRAMMABLE DELAY

(71) Applicant: Advanced Micro Devices, Inc., Sunnyvale, CA (US)

(72) Inventors: Deepesh John, Austin, TX (US); Teja Singh, Sunnyvale, CA (US); Sundar Rangarajan, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 14/178,477

(22) Filed: Feb. 12, 2014

(65) Prior Publication Data
US 2014/0232431 A1    Aug. 21, 2014

Related U.S. Application Data

(60) Provisional application No. 61/765,574, filed on Feb. 15, 2013.

(51) Int. Cl.
H03K 19/0175    (2006.01)

(52) U.S. Cl.
CPC ................................ H03K 19/0175 (2013.01)

USPC ................ 326/93; 326/38; 327/161; 327/156

(58) Field of Classification Search
None
See application file for complete search history.

(56) References Cited

U.S. PATENT DOCUMENTS

| | | | |
|---|---|---|---|
| 7,088,136 B1 * | 8/2006 | Lewis | 326/46 |
| 7,570,079 B2 * | 8/2009 | Sima et al. | 326/41 |
| 7,583,103 B2 * | 9/2009 | Lewis et al. | 326/38 |
| 8,212,585 B1 * | 7/2012 | Price | 326/39 |
| 8,339,166 B2 * | 12/2012 | John et al. | 327/156 |
| 2008/0180159 A1 * | 7/2008 | Campbell et al. | 327/434 |
| 2008/0238476 A1 * | 10/2008 | Lewis et al. | 326/40 |
| 2010/0277219 A1 * | 11/2010 | Campbell et al. | 327/434 |
| 2011/0304371 A1 * | 12/2011 | Ravi et al. | 327/175 |
| 2012/0119805 A1 * | 5/2012 | John et al. | 327/161 |

* cited by examiner

*Primary Examiner* — Crystal L Hammond
(74) *Attorney, Agent, or Firm* — Volpe and Koenig, P.C.

(57) ABSTRACT

An integrated circuit device comprising first circuitry including first logic devices and a clock tree for distributing a clock signal to the first logic devices and second circuitry comprising second logic devices, a first clock gater and a second clock gater. The first and second clock gaters comprise a programmable delay circuit.

20 Claims, 7 Drawing Sheets

US 8,947,124 B2

CLOCK GATER WITH INDEPENDENTLY PROGRAMMABLE DELAY

CROSS REFERENCE TO RELATED APPLICATIONS

This application is related to U.S. Provisional App. 61/765,574, filed on Feb. 15, 2013 and U.S. Pat. No. 8,339,166, issued on Dec. 25, 2012, the entire disclosure and contents of which are hereby incorporated by reference.

BACKGROUND

1. Field

The embodiments described herein relate generally to circuit manufacturing and, more particularly, to clock gaters with a programmable delay.

2. Background

Integrated circuit devices are typically designed using a combination of computer-automated design techniques and manual design techniques. The portions of the design layout generated by computer-automated tools are commonly referred to as tiles, and the portions of the design layout manually generated by circuit designers are commonly referred to as macros.

In a synchronous digital system, the clock signal is used to define a time reference for the switching of data throughout the system. The clock distribution network (or clock tree, when this network forms a tree) distributes the clock signal(s) from a source point to all the elements that use the same clock. The clock signal is distributed to tiles as well as macros.

For a macro, the clock tree logic is placed and routed by custom design. On the other hand, within a tile it is common for the clock tree to be at least partially designed by computer-automated tools. An automated synthesis tool can generate a tree that starts with the core clock signal (CCLK) and branches to all of the state elements in the tile. As the circuit design progresses, the number of stages in the clock tree generated by the automated synthesis may change. The number of stages in a clock tree is an important parameter in circuit design, because it determines the delay of the clock signal. For example, a clock signal measured at a certain point in the circuit can be delayed in proportion to the number of stages it has to pass through.

The automated generation of clock trees may create complications during the design process. The design of computer generated tiles and the custom macros generally proceed at different rates and in different order. For example, it is common for some tile synthesis operations to occur after the macro designs have been completed. One of these synthesis operations may yield a change in the number of stages in the clock tree. This change in turn may require the manual redesign of the macros to accommodate this change in clock signal delays.

In order to simulate the integrated circuit device operation during the design process, the clock trees in the macros need to be consistent with those in the tiles. Also, consistency is required for the final design. Adjustments to maintain clock delay consistency require significant time and effort, and may need to be repeated several times during the design phase.

BRIEF SUMMARY

Integrated circuits, a method and a computer-readable medium are provided. An embodiment comprises an integrated circuit device comprising first circuitry comprising first logic devices and a clock tree for distributing a clock signal to the first logic devices and second circuitry comprising second logic devices, a first clock gater and a second clock gater. Each of the first and second clock gaters comprises a programmable delay circuit including a plurality of delay elements, each element imposing a different amount of delay. Each of the first and second clock gaters is operable to receive the clock signal and configurable to distribute the clock signal to the second logic devices through one of the plurality of delay elements. The first clock gater is operable to distribute the clock signal to a first subset of the second logic devices and the second clock gater is operable to distribute the clock signal to a second subset of the second logic devices.

Further features and advantages of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
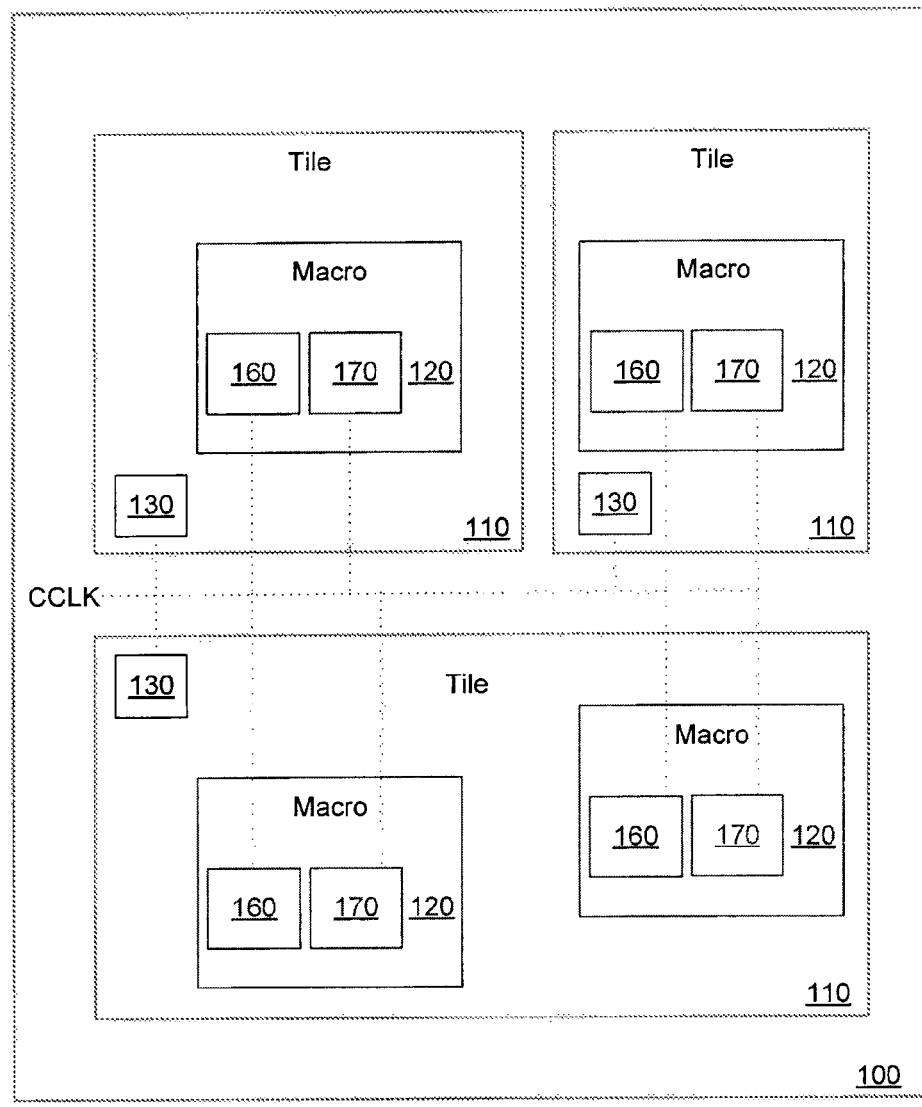
FIG. 1 depicts an integrated circuit device including a clock gater with a programmable delay, according to an embodiment.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

In the detailed description that follows, references to "one embodiment," "an embodiment," "an example embodiment,"

etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The term "embodiments" does not require that all embodiments include the discussed feature, advantage or mode of operation. Alternate embodiments may be devised without departing from the scope of the disclosure, and well-known elements of the disclosure may not be described in detail or may be omitted so as not to obscure the relevant details. In addition, the terminology used herein is for the purpose of describing particular embodiments only and is not intended to be limiting of the disclosure. For example, as used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof Referring to FIG. 1, the embodiments shall be described in the context of an integrated circuit device 100. The integrated circuit device 100 includes tile portions 110 and macros 120. The number of tile portions 110 and the number of macros 120 illustrated is for exemplary purposes and may vary. The integrated circuit device 100 may be a microprocessor, graphics processing unit (GPU), memory device, etc. Exemplary macros 120 may include, for example, synchronous random access memory (SRAM) array macros, such as instruction caches, data caches, predictor tables, etc. Multiple instances of some of the macros 120 may be present. The tile portions 110 are typically designed using an automated circuit synthesis tool, and the macros 120 are typically designed manually by circuit designers using, for example, computer-aided design (CAD) tools. As part of the automated design process for the tile portions 110, a clock tree 130 is typically generated. In one embodiment, each tile 110 may have its own clock tree 130. Interfaces may be defined between different tiles 110 or between a macro 120 in one tile 110 and another tile 110 or a macro 120 in a different tile 110.

Figure 2:
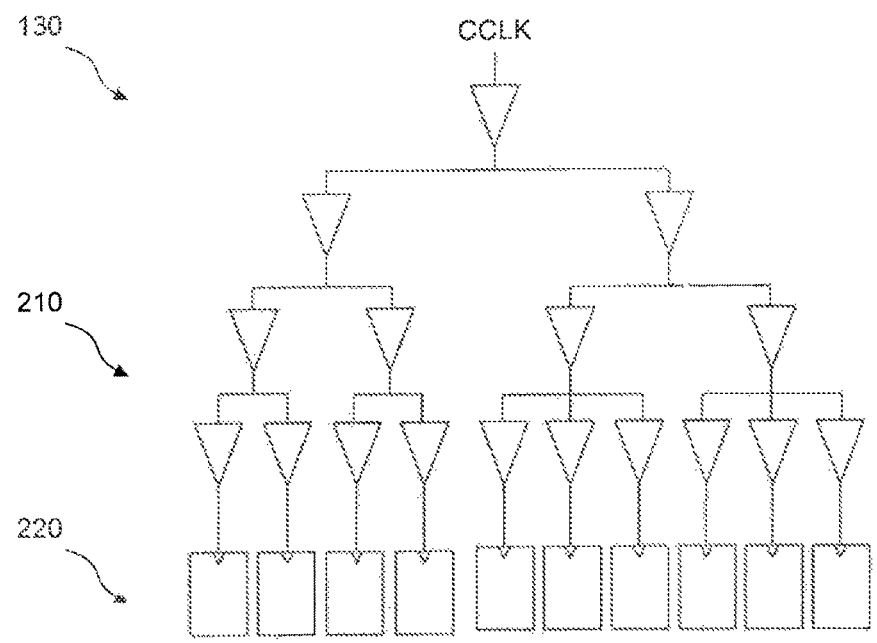
FIG. 2 is a circuit diagram of an illustrative clock tree, according to an embodiment.

FIG. 2 depicts a model of an exemplary clock tree 130. Clock tree 130 has a number of stages 140 that start from the core clock signal (CCLK) and branch to the logic elements 150 in the tile 110. Every stage adds an amount of delay to the clock signal as received at the logic elements 150. As the design progresses, the number of stages 140 may change. Hence, the amount of delay imposed by the clock tree 130 may change throughout the design process.

Returning to FIG. 1, the macros 120 includes clock gaters 160 and 170. The clock gaters can be configured to introduce a delay that matches the delay provided by clock tree 130. In this way, the clock signal received by tile 110 can be synchronized with clock signals received by macro 120. In an embodiment, clock gaters 160 and 170 provide a programmable delay that can be changed if the characteristics of the clock tree 130 change during the design process. Also, once the integrated circuit device 100 has been manufactured, the individual timings of the macros 120 may be measured and the delays tuned to optimize performance.

Figure 3:
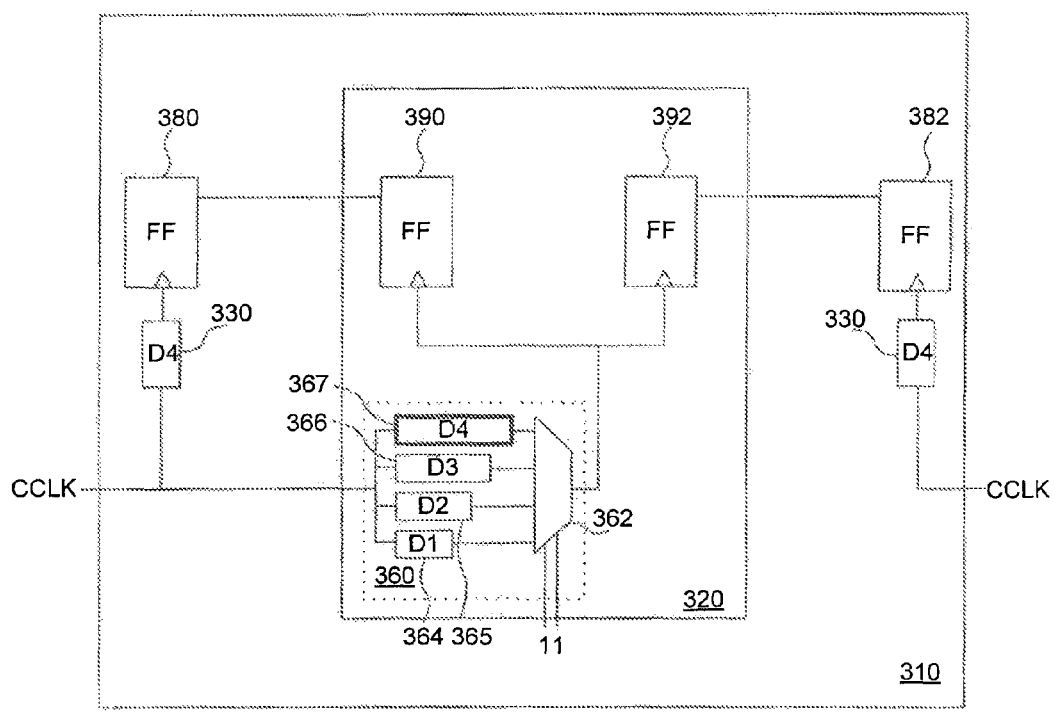
FIG. 3 depicts a diagram of an integrated circuit device illustrating the configuration of a clock gater adjusted to changes in the clock tree, according to an embodiment.

FIG. 3 is a simplified diagram of a tile 310 including macro 320. The clock tree 330 for the tile is represented by a delay element imposing a delay D4. The logic devices 380 and 382 (depicted as flip flops, by way of example) of the tile 310 receive the clock from the clock tree 330, and the logic devices 390 and 392 of the macro 320 receive the clock from the clock gater 360. In the illustrated embodiment, the clock gater 360 includes a multiplexer 362 and a plurality of delay elements 364-367. The delay elements 364-367 each impose a different amount of delay on the clock signal. The delay elements 364-367 may be implemented using various logic elements, such as shown in the clock tree 330 of FIG. 2.

In the example illustrated in FIG. 3, the clock signal received by tile 310 is delayed by the delay D4 of clock tree 330. In one embodiment, this may represent 4 stages in the clock tree 330. To synchronize the clock for the macro 320 with that of the tile 310, the multiplexer 362 is configured to select the delay element 367, also corresponding to a delay of D4. For example, the delay element 367 may have four drivers or inverters in series to create the same delay as the clock tree 130. The multiplexer 362 can be configured, for example, by using a control register of the device or by blowing fuses. During the design phase the blowing of fuses can be simulated. In an actual design, various tests and characterizations can be performed to select the appropriate fuse pattern for the multiplexer 362.

The situation illustrated in FIG. 3 may represent the configuration of the tile 310 and the clock tree 330 at a particular point in the design of a device 300. At a later stage in the design cycle, the design of the tile 310 may have been changed by the automated synthesis tool, such that the delay imposed by the clock tree 330 changes to, for example, D1. To synchronize the clock for the macro 320 with that of the tile 310, the multiplexer 362 can be configured to select the delay element 364, which corresponds to a delay of D1.

In this manner, changes in the design of the tile 310 that affect the timing may be addressed simply by reconfiguring the multiplexer 362, thereby avoiding a redesign of the macro 320. This results in increased efficiency and decreased design costs. The programmable clock gater 360 obviates need to redesign macro 320 prior to allowing the simulation testing of device 300 to proceed after a change in clock tree 330. Furthermore, the need for designer input is also obviated, resulting in decreased engineering costs. Further design iterations can be accounted for simply by reconfiguring the multiplexer 362 to select the delay element 364-367 corresponding to the delay imposed by the clock tree 330. The number of delay elements 364-367 provided in the clock gater 360 may vary depending on the degree of granularity desired for timing changes.

Figure 4:
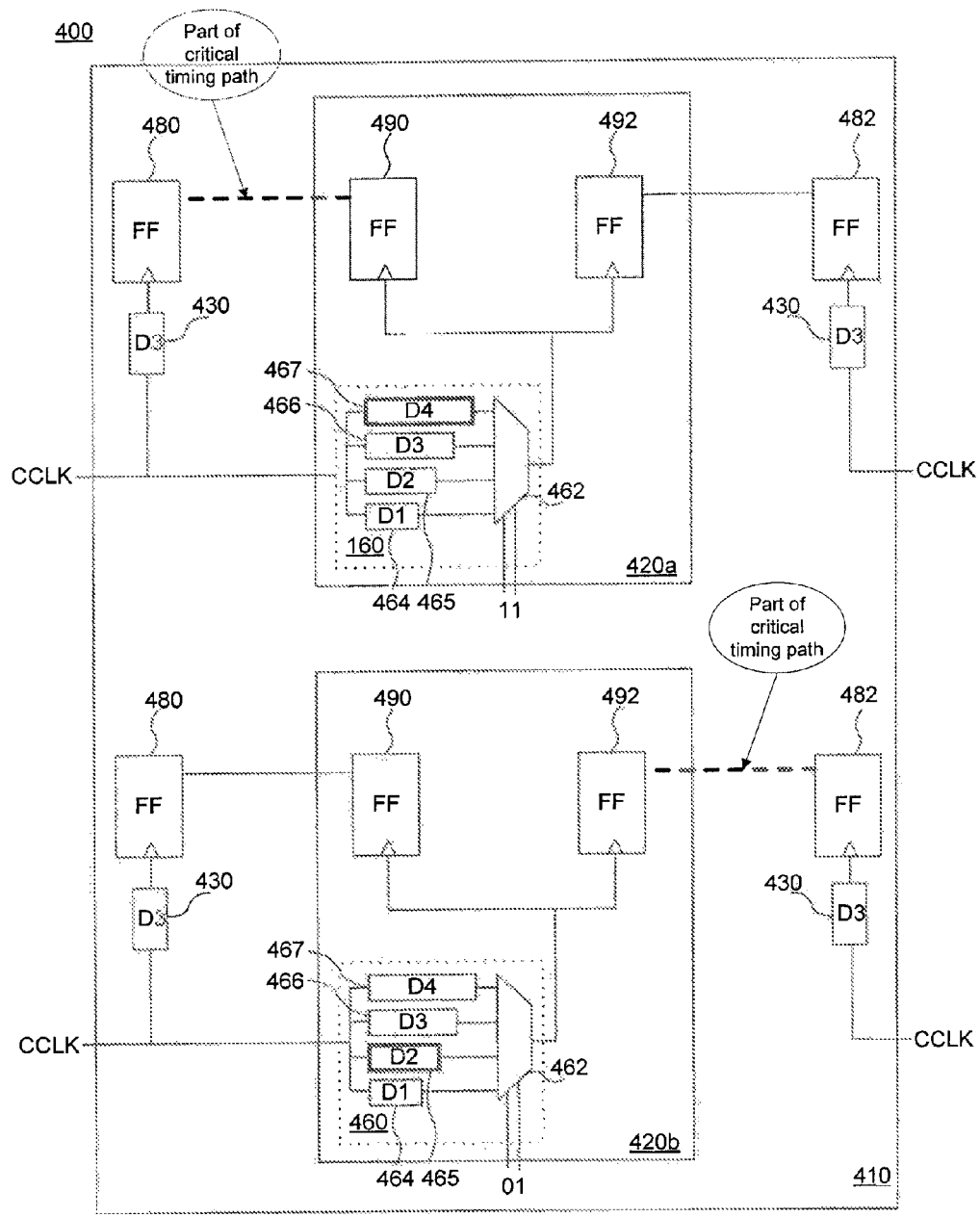
FIG. 4 depicts a diagram of an integrated circuit device illustrating the configuration of a clock gater adjusted after a critical timing path analysis, according to an embodiment.

FIG. 4 depicts a device 400 including a tile 410 with two instances of the same macro 420a, 420b, according to an embodiment. In the example shown, macros 420a and 420b include an input logic device 490 (a flip flop, by way of example) and an output logic device 492 (also a flip flop, by way of example). Both the input and the output logic devices receive the clock signal from clock gater 460.

During the design phase, timing testing may be implemented for the design using simulation tools. Assume the clock tree 430 of the tile 410 has a delay of D3. Initially, the multiplexers 462 for the macros 420a, 420b would both be configured to select the delay element 466 (i.e., D3) to synchronize the tile 410 and the macros 420a and 420b.

However, during the timing simulation for the device 400, it may be determined that the input signals to the macro 420a are on the critical timing path, while the outputs are not. Signals in the critical timing path may be delayed more than other signals, and may arrive towards the end of a clock cycle. In order to prevent a switch of flip flop 490 before the input signal arrives, the programmable delay of the clock gater 460 of macro 420a can be increased by configuring the multiplexer 462 to select a longer delay element 467 (i.e., D4). The longer delay allows more time for input signals to set up.

In contrast, consider that the timing simulation also revealed that the output signals of macro 420b are on the critical timing path. In order to prevent a switch of the logic device 480 that reads these output signals, the programmable delay of the clock gater 460 for the macro 420b can be decreased by configuring the multiplexer 462 to select a shorter delay element 465 (i.e., D2). The shorter delay allows the output signals to be generated slightly earlier, and allows them to be correctly read by logic device 482 before its clock edge.

The previous example of FIG. 4 shows the tuning of macro clock signal delay, while running timing simulation on the tile 410. However, the longest timing paths in timing analysis may not correspond to the longest timing paths when the device 400 is actually fabricated. Hence, once the design of the integrated circuit device is completed, and the device 400 has been fabricated, the clock gaters 460 for one or more macros 420 may be tuned to increase the actual performance of the device by further adjusting the macro interface timing.

There may be instances in which tuning the clock signal delay may be difficult, particularly when both the input and the output of a macro are part of the critical timing path. In such a scenario, increasing the clock signal delay may allow the input signal more time to set up correctly before the clock edge, but may result in the output signal not being generated with enough time to be correctly read before the next clock edge. Conversely, decreasing the clock signal delay may allow the output signal to be timely generated, but the input signal may not be properly set before being read. An approach to prevent this issue from affecting performance is to multiple clock gaters within a macro to allow for more precise tuning of the clock delays.

Figure 5:
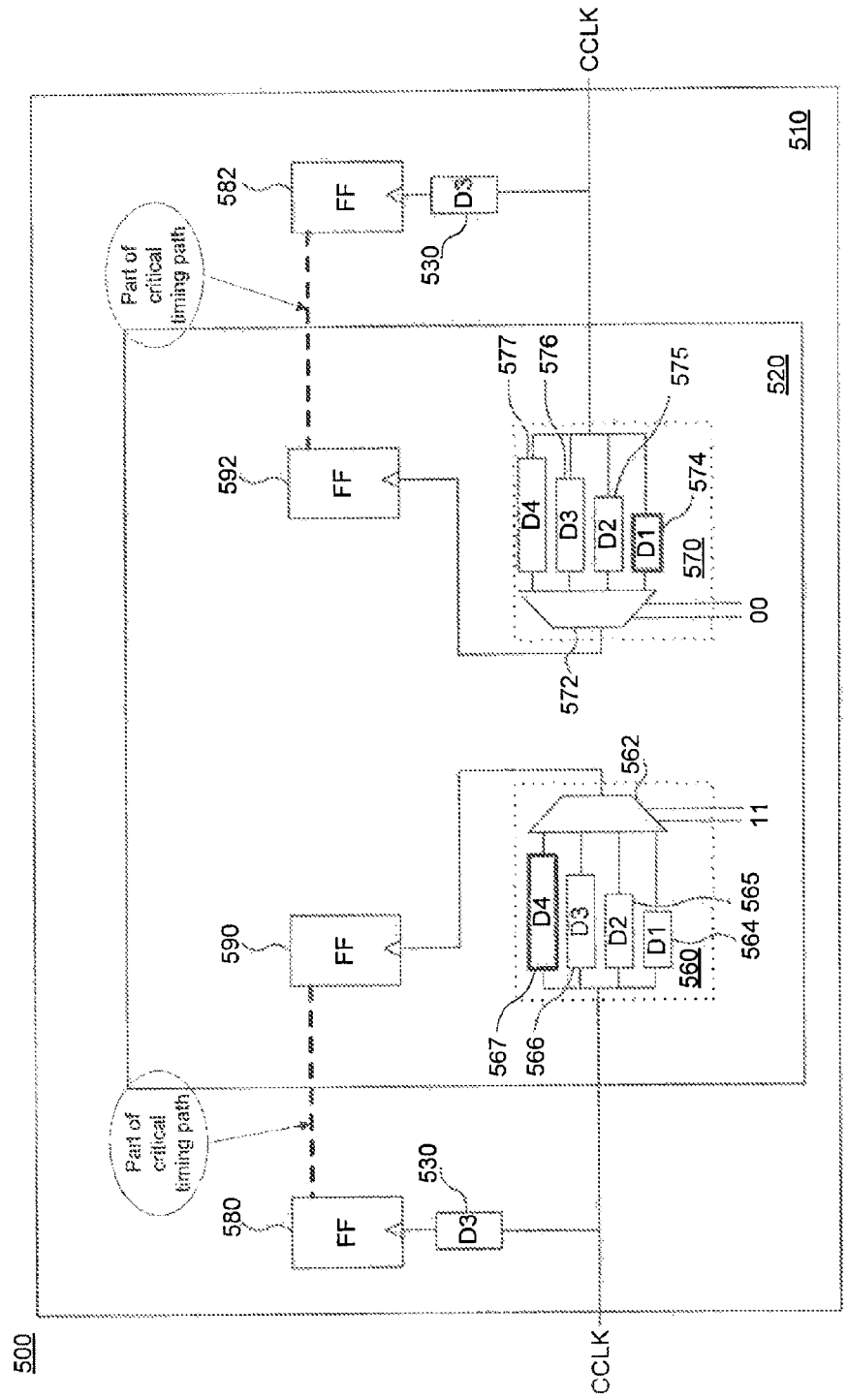
FIG. 5 is a diagram of an integrated circuit device illustrating the configuration of multiple clock gaters to tune the timing of the device after a critical timing path analysis, according to an embodiment.

FIG. 5 depicts a device 500 including a macro with multiple clock gaters, according to an embodiment. In the example shown, device 500 in FIG. 5 includes a tile 510 and a macro 520. Macro 520 comprises clock gaters 560 and 570, which provide clock signals to input logic device 590 and output logic device 592, respectively. Input logic device 580 reads the input signal to the macro from logic device 580, while output logic device 582 outputs the output signal from the macro to logic device 582.

If the timing simulation reveals that the input received at input logic device 590 is part of the critical timing path, the control signals to clock gater multiplexer 562 can be configured apply a longer delay to the clock signal, for example, delay D4. If the timing simulation also reveals that the output generated by output logic device 582 is part of the critical timing path, the control signals to multiplexer 572 can be configured to apply a shorter delay to the clock signal, for example, delay D1. This avoids the complication of having to find a single intermediate delay that will avoid untimely clock edges at both the input and output.

As previously mentioned, the longest timing paths in timing analysis may not correspond to the longest timing paths when the device is actually fabricated. Once the design of the integrated circuit device is completed, and the device 500 has been fabricated, the clock gaters 560 and 570 for one or more macros 520 may be tuned to increase the actual performance of the device by further adjusting the macro interface timing.

Figure 6:
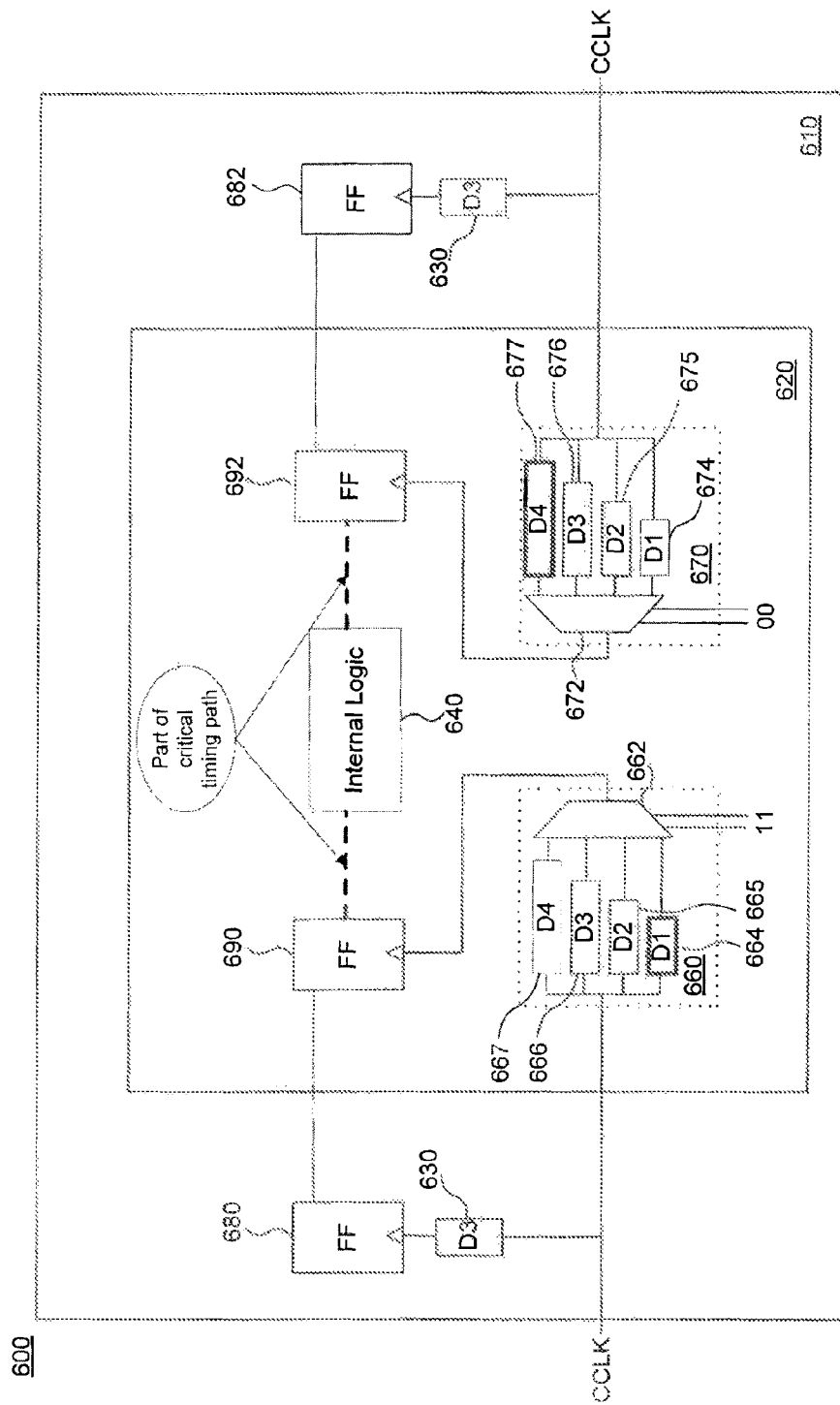
FIG. 6 is a diagram of a computing apparatus that may be programmed to direct the fabrication of the integrated circuit device, according to an embodiment.

FIG. 6 depicts a device 600 including a macro with multiple clock gaters in a scenario where the internal logic of the macro is part of the critical timing path, according to an embodiment. In the example shown, device 600 in FIG. 6 includes a tile 610 and a macro 620. Macro 620 comprises internal logic 640 that can include state logic. Although discussion of the macros' internal logic has been omitted from the devices in the previous figures, it should be understood the macros can contain internal logic including state elements.

In the example shown, macro 620 further includes clock gaters 660 and 670, which provide clock signals to input logic device 690 and output logic device 692, respectively. Input logic device 680 reads the input signal to the macro from logic device 680, while output logic device 682 outputs the output signal from the macro to logic device 682.

In the example depicted in FIG. 6, the timing simulation reveals the internal logic 640 is part of the critical timing path, while the input and output paths are not. In this scenario, clock gater multiplexer 662 can be configured to apply a shorter delay, for example delay D1, while clock gater multiplexer 672 can be configured to apply a longer delay, for example delay D4. This provides the input signal to internal logic 640 earlier and allows more time for the output signal to the internal logic 640 to be properly set.

As previously mentioned, the longest timing paths in timing analysis may not correspond to the longest timing paths when the device is actually fabricated. Once the design of the integrated circuit device is completed, and the device 600 has been fabricated, the clock gaters 660 and 670 for one or more macros 620 may be tuned to increase the actual performance of the device by further adjusting the macro's internal timing.

Although the examples of FIGS. 3-6 illustrate timing interfaces between a macro and the tile in which it is formed, it is contemplated that the timing interface may be defined between the macro and a different tile in the case where multiple tiles are present in the integrated circuit device.

Figure 7:
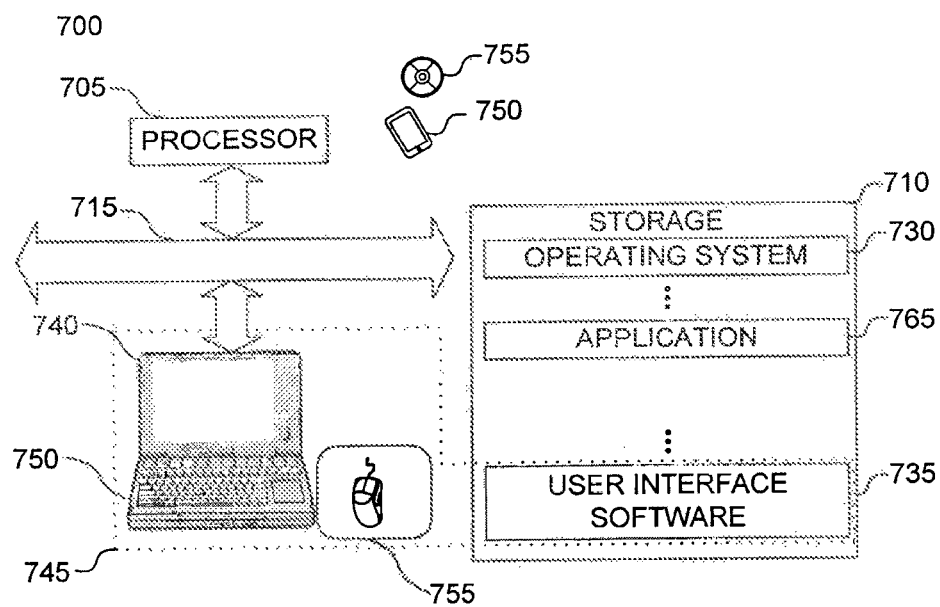
FIG. 7 illustrates a simplified diagram of selected portions of the hardware and software architecture of a computing apparatus, such as may be employed in some embodiments.

FIG. 7 illustrates a simplified diagram of selected portions of the hardware and software architecture of a computing apparatus 700 such as may be employed in some aspects of the present subject matter. The computing apparatus 700 includes a processor 705 communicating with storage 710 over a bus system 715. The storage 710 may include a hard disk and/or random access memory ("RAM") and/or removable storage, such as a magnetic disk 720 or an optical disk 725. The storage 710 is also encoded with an operating system 730, user interface software 735, and an application 765. The user interface software 735, in conjunction with a display 740, implements a user interface 745. The user interface 745 may include peripheral I/O devices such as a keypad or keyboard 750, mouse 755, etc. The processor 705 runs under the control of the operating system 730, which may be practically any operating system known in the art. The application 765 is invoked by the operating system 730 upon power up, reset, user interaction, etc., depending on the implementation of the operating system 730. The application 765, when invoked, performs a method of the present subject matter. The user may invoke the application 765 in conventional fashion through the user interface 745. Note that although a stand-alone system is illustrated, there is no need for the data to reside on the same, computing apparatus 700 as the application 765 by which it is processed. Some embodiments of the present subject matter may therefore be implemented on a distributed computing system with distributed storage and/or processing capabilities.

It is contemplated that, in some embodiments, different kinds of hardware descriptive languages (HDL) may be used in the process of designing and manufacturing very large scale integration circuits (VLSI circuits), such as semiconductor products and devices and/or other types semiconductor devices. Some examples of HDL are VHDL and Verilog/Verilog-XL, but other HDL formats not listed may be used. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., storage 710, disks 720, 725, solid state storage, and the like). In one embodiment, the GDSII data (or other similar data) may be adapted to configure a manufacturing facility (e.g., through the use of mask works) to create devices capable of embodying various aspects of the instant invention. In other words, in various embodiments, this GDSII data (or other similar data) may be programmed into the computing apparatus 700, and executed by the processor 705 using the application 765, which may then control, in whole or part, the operation of a semiconductor manufacturing facility (or fab) to create semiconductor products and devices. For example, in one embodiment, silicon wafers containing the tiles, macros, clock gaters disclosed herein may be created using the GDSII data (or other similar data).

It is also contemplated that the computing apparatus 700 and the application 765 may be used to perform performance modeling of an integrated circuit device according to an embodiment. For example, a timing analysis of the tiles and macros may be performed as described above to identify critical timing paths and adjust the clock gaters accordingly.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An integrated circuit device comprising:
   first circuitry comprising first logic devices and a clock tree configured to distribute a clock signal to the first logic devices; and
   second circuitry comprising second logic devices, a first clock gater and a second clock gater,
   wherein each of the first and second clock gaters comprises a programmable delay circuit including a plurality of delay elements, each element configured to impose a different amount of delay,
   wherein each of the first and second clock gaters is operable to receive the clock signal and configurable to distribute the clock signal to the second logic devices through one of the plurality of delay elements, and
   wherein the first clock gater is operable to distribute the clock signal to a first subset of the second logic devices and the second clock gater is operable to distribute the clock signal to a second subset of the second logic devices.

2. The integrated circuit of claim 1, wherein each of the first and second clock gaters farther comprise a multiplexer coupled to receive the clock signal and configurable to select one of the plurality of delay elements.

3. The integrated circuit of claim 2, wherein each of the first and second clock gaters is configured to select a different delay element.

4. The integrated circuit of claim 1, wherein first or second clock gater is configurable to distribute the clock signal through a delay element by setting a value in a control register.

5. The integrated circuit of claim 1, wherein the first or second clock gater is configurable to distribute the clock signal through a delay element by blowing a fuse.

6. The integrated circuit of claim 1, wherein the first circuitry comprises an instance of a tile and the second circuitry comprises an instance of a macro.

7. The integrated circuit of claim 1, wherein the first subset comprises input state devices and the second subset comprises output state devices.

8. A method, comprising:
   distributing a clock signal through a clock tree to first logic devices in a first circuitry; and
   distributing the clock signal to second logic devices in a second circuitry,
   wherein the second circuitry comprises a first clock gater and a second clock gater, wherein each of the first and second clock gaters comprises a programmable delay circuit including a plurality of delay elements, each element imposing a different amount of delay,
   wherein distributing the clock signal comprises configuring each of the first and second clock gaters to receive and distribute the clock signal to the second logic devices through one of the plurality of delay elements, and
   wherein the first clock gater is configured to distribute the clock signal to a first subset of the second logic devices and the second clock gater is configured to distribute the clock signal to a second subset of the second logic devices.

9. The method of claim 8, wherein each of the first and second clock gaters further comprise a multiplexer coupled to receive the clock signal and configurable to select one of the plurality of delay elements.

10. The method of claim 9, further comprising configuring each of the first and second clock gaters to select a different delay element.

11. The method of claim 8, wherein first or second clock gater is configurable to distribute the clock signal through a delay element by setting a value in a control register.

12. The method of claim 8, wherein the first or second clock gater is configurable to distribute the clock signal through a delay element by blowing a fuse.

13. The method of claim 8, wherein the first subset comprises input state devices and the second subset comprises output state devices.

14. A computer-readable storage medium having instructions stored thereon, execution of which by a processor cause the processor to perform operations, the operations causing a manufacturing facility to create an apparatus comprising:
   first circuitry including first logic devices and a clock tree configured to distribute a clock signal to the first logic devices; and
   second circuitry comprising second logic devices, a first clock gater and a second clock gater, wherein each of the first and second clock gaters comprises a programmable delay circuit including a plurality of delay elements, each element configured to impose a different amount of delay,
   wherein each of the first and second clock gaters is operable to receive the clock signal and configurable to distribute the clock signal to the second logic devices through one of the plurality of delay elements, and
   wherein the first clock gater is operable to distribute the clock signal to a first subset of the second logic devices and the second clock gater is operable to distribute the clock signal to a second subset of the second logic devices.

15. The computer-readable storage medium of claim 14, wherein each of the first and second clock gaters further comprise a multiplexer coupled to receive the clock signal and configurable to select one of the plurality of delay elements.

16. The computer-readable storage medium of claim 15, wherein each of the first and second clock gaters is configured to select a different delay element.

17. The computer-readable storage medium of claim 14, wherein first or second clock gater is configurable to distribute the clock signal through a delay element by setting a value in a control register.

18. The computer-readable storage medium of claim 14, wherein the first or second clock gater is configurable to distribute the clock signal through a delay element by blowing a fuse.

19. The computer-readable storage medium of claim 14, wherein the first circuitry comprises an instance of a tile and the second circuitry comprises an instance of a macro.

20. The computer-readable storage medium of claim 14, wherein the first subset comprises input state devices and the second subset comprises output state devices.

\* \* \* \* \*

UNITED STATES PATENT AND TRADEMARK OFFICE
CERTIFICATE OF CORRECTION

PATENT NO. : 8,947,124 B2  
APPLICATION NO. : 14/178477  
DATED : February 3, 2015  
INVENTOR(S) : John et al.

Page 1 of 1

It is certified that error appears in the above-identified patent and that said Letters Patent is hereby corrected as shown below:

IN THE CLAIMS

Claim 2, column 8, line 22, change "farther" to -- further --.

Signed and Sealed this  
Sixteenth Day of June, 2015

Michelle K. Lee  
*Director of the United States Patent and Trademark Office*